United States Patent [19]

McHenry

[11] Patent Number: 5,849,355

[45] Date of Patent: Dec. 15, 1998

[54] ELECTROLESS COPPER PLATING

[75] Inventor: Michael R. McHenry, Lee's Summit, Mo.

[73] Assignee: AlliedSignal Inc., Morristown, N.J.

[21] Appl. No.: 717,195

[22] Filed: Sep. 18, 1996

Related U.S. Application Data

[60] Provisional application No. 60/034,313 Sep. 25, 1995 and provisional application No. 60/005,946 Oct. 27, 1995.

[51] Int. Cl.<sup>6</sup> ......................................... B05D 5/12
[52] U.S. Cl. .......................... 427/79; 29/602.1; 333/167; 427/123; 427/125; 427/299; 427/304; 427/305; 427/309
[58] Field of Search ..................... 29/602.1; 333/167; 427/309, 299, 79, 304, 305, 307, 123, 125

[56] References Cited

U.S. PATENT DOCUMENTS

| | | | |
|---|---|---|---|
| 3,765,082 | 10/1973 | Zyetz | 29/602 |
| 3,833,872 | 9/1974 | Marcus et al. | 336/83 |
| 4,310,821 | 1/1982 | Frances | 336/200 |
| 4,313,152 | 1/1982 | Vranken | 361/402 |
| 4,543,553 | 9/1985 | Mandai et al. | 336/83 |
| 4,613,843 | 9/1986 | Esper et al. | 336/232 |
| 4,626,816 | 12/1986 | Blumkin et al. | 336/192 |
| 4,641,114 | 2/1987 | Person | 333/161 |
| 4,730,095 | 3/1988 | Richter-Jorgensen | 219/121.85 |
| 4,914,260 | 4/1990 | Suzuki et al. | 174/255 |
| 4,918,418 | 4/1990 | Tsala | 336/180 |
| 4,926,292 | 5/1990 | Maple | 361/402 |
| 4,959,631 | 9/1990 | Hasegawa et al. | 336/83 |
| 4,999,597 | 3/1991 | Gaynor | 333/246 |
| 5,225,969 | 7/1993 | Takaya et al. | 361/414 |
| 5,298,687 | 3/1994 | Rapoport et al. | 174/261 |
| 5,358,907 | 10/1994 | Wong | 427/309 X |
| 5,363,080 | 11/1994 | Breen | 336/192 |
| 5,380,451 | 1/1995 | Rieger | 427/309 X |
| 5,398,400 | 3/1995 | Breen | 29/602.1 |
| 5,416,356 | 5/1995 | Staudinger et al. | 257/531 |
| 5,532,667 | 7/1996 | Haertling et al. | 336/177 |

FOREIGN PATENT DOCUMENTS

| | | |
|---|---|---|
| 0 209 816 | 1/1987 | European Pat. Off. . |
| 0 433 176 A2 | 6/1991 | European Pat. Off. . |
| 405205943 A | 8/1993 | Japan . |

OTHER PUBLICATIONS

Monolithic Multicomponents Ceramic (MMC) Substrate, by Utsumi et al., 1985, Tokyo, Japan.

PCT/US 96/15441 International Search Report, completed Jan. 22, 1997.

Dialog Computer Search related to EP 209816 and U.S. Patent No. 4,730,095.

Steinberg, *An Alternative Technique for Producing Cofired Ceramic Circuits and Components*, Ferrite Materials Information Data Book by Heraeus Inc., W. Conshohocken, PA (undated).

*Primary Examiner*—Michael Lusignan
*Attorney, Agent, or Firm*—Stinson, Mag & Fizzell, P.C.; Frank B. Flink, Jr.

[57] ABSTRACT

An optimized electroless copper plating technique suitable for plating electroless copper upon ceramics.

3 Claims, 7 Drawing Sheets

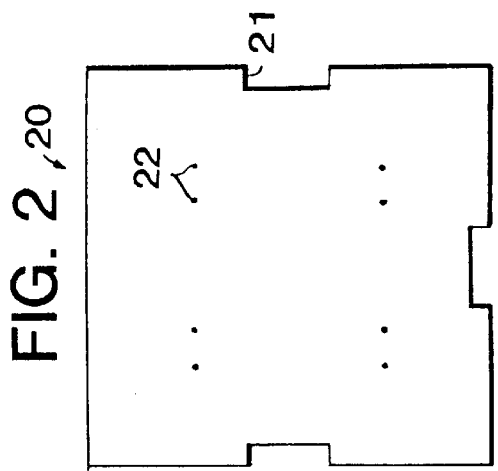
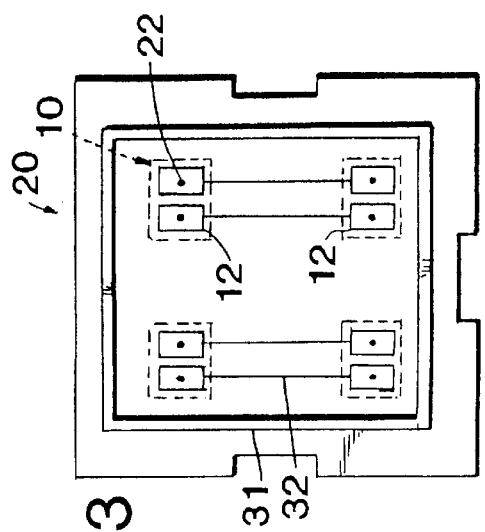
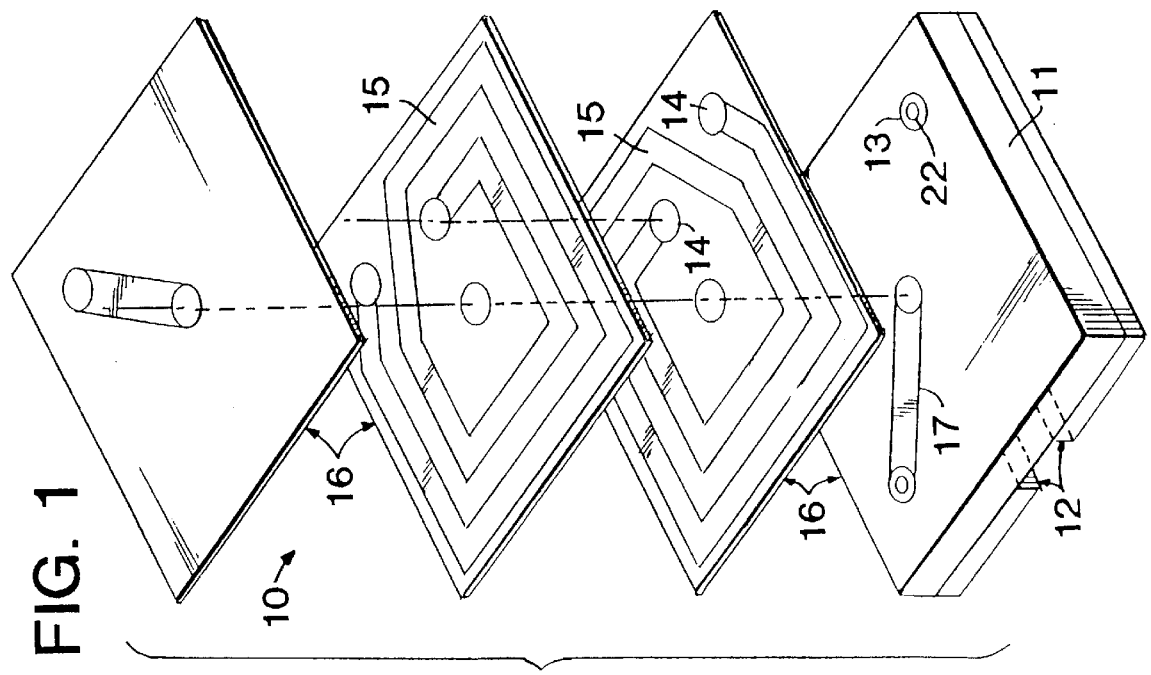

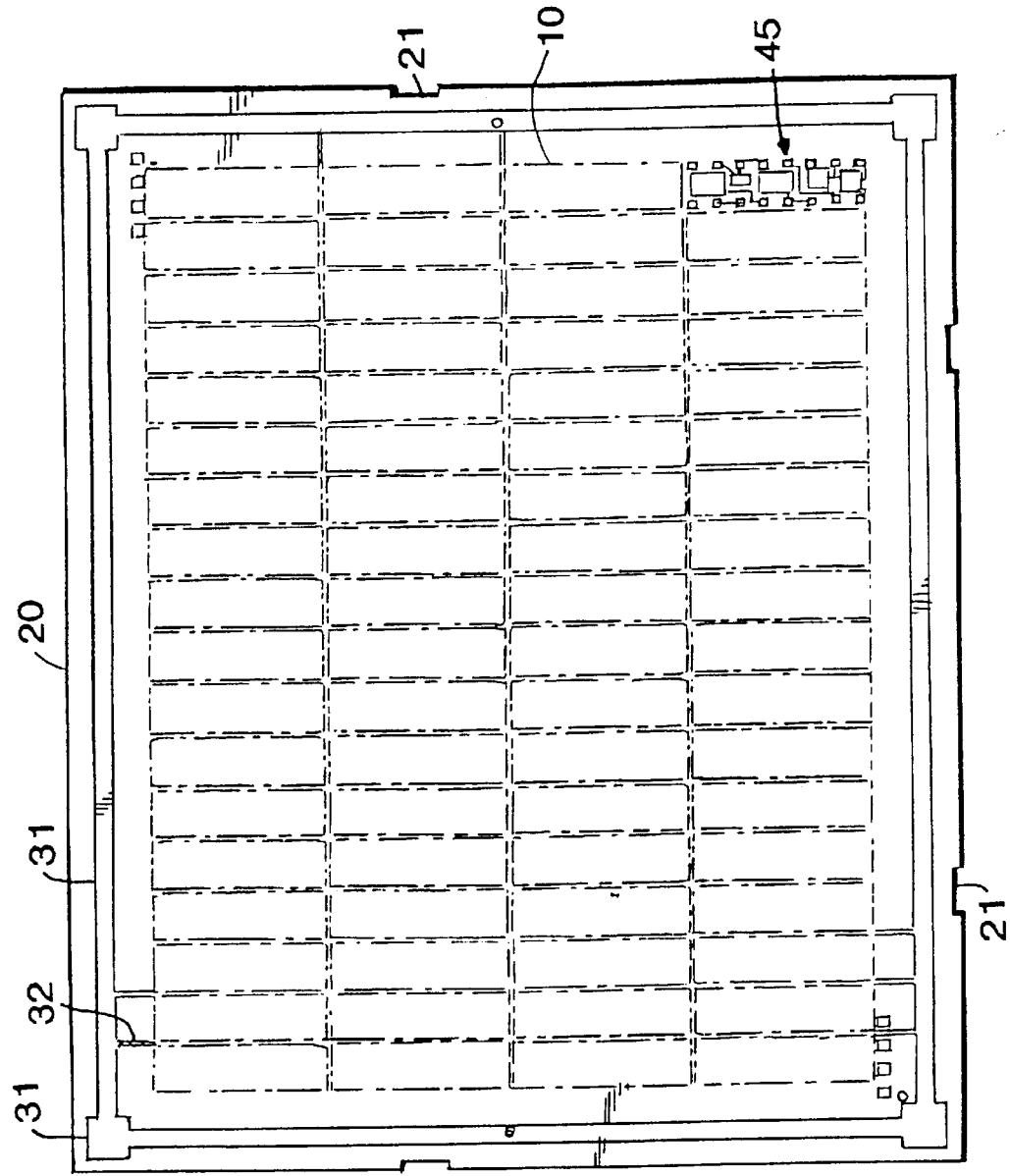

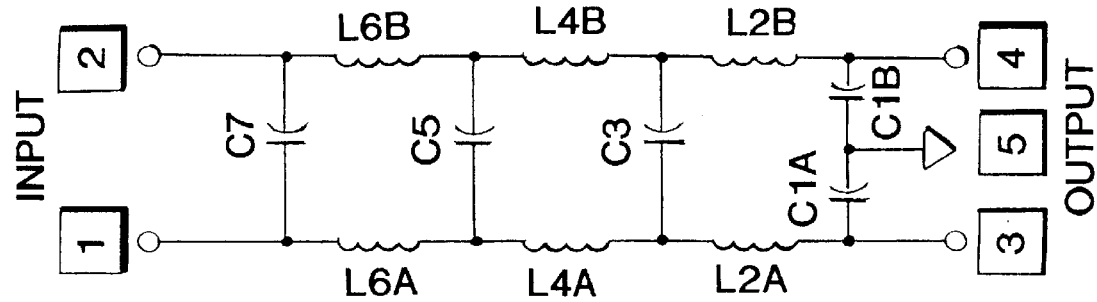
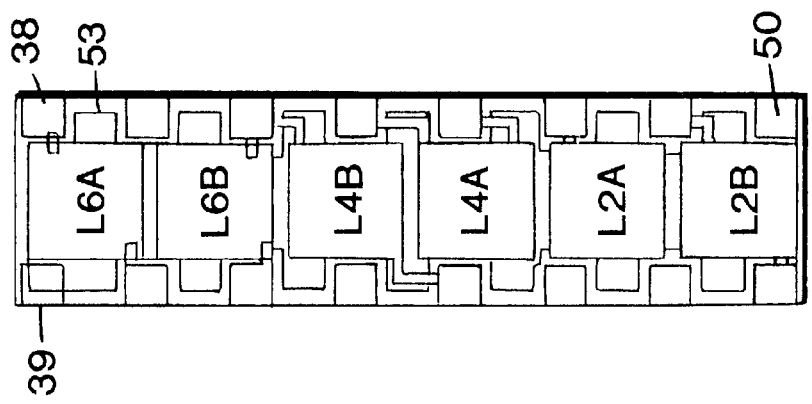
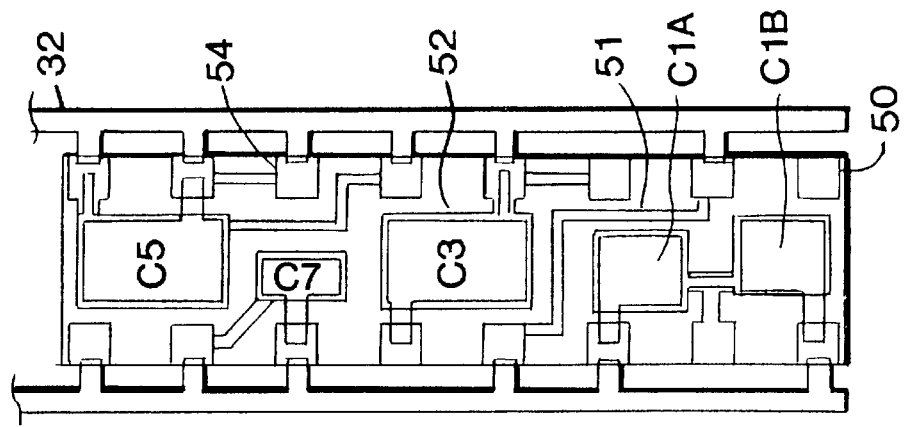

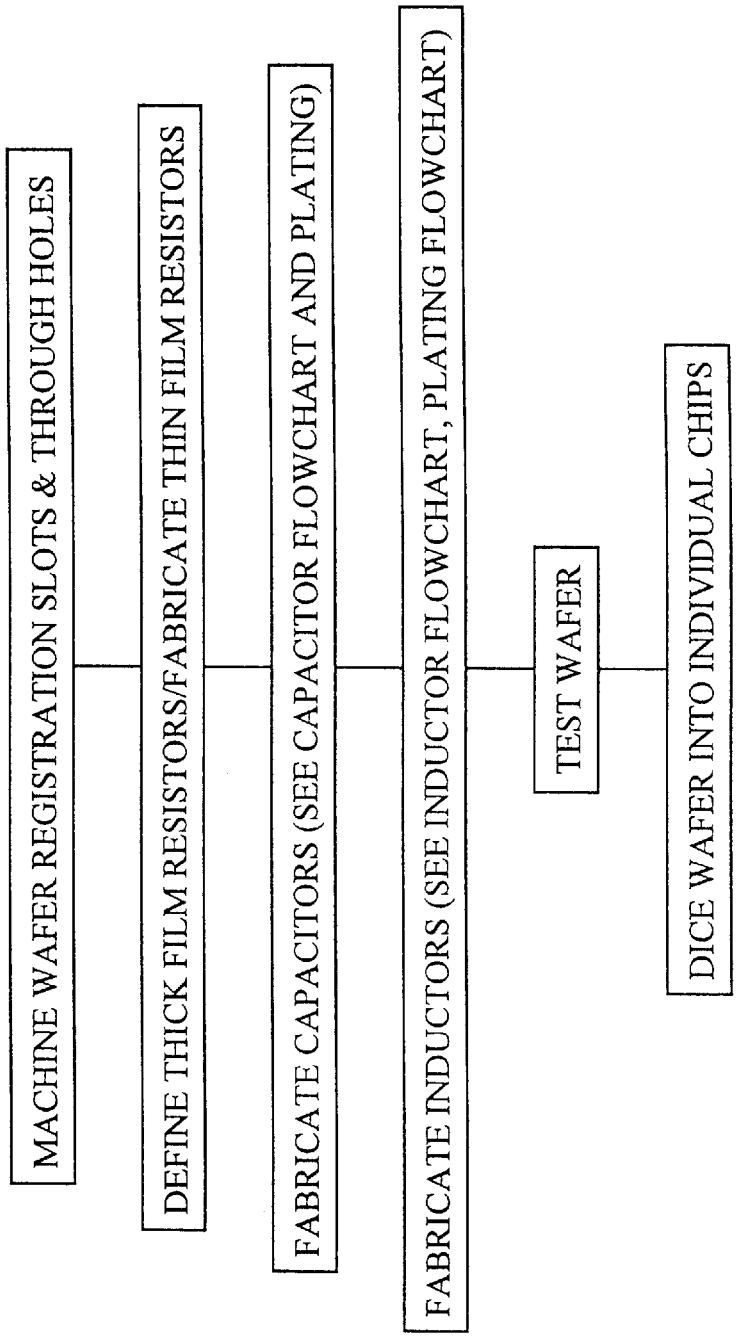

ELECTROLESS COPPER PLATING

This invention is entitled to priority due to provisional U.S. application Ser. No. 60/034,313, filed Sep. 25, 1995 (original regular application Ser. No. 08/533,248, converted to provisional Sep. 12, 1996) and provisional U.S. application Ser. No. 06/005,946, filed Oct. 27, 1995. The U.S. Government has rights in this invention pursuant to contract number DE-AC04-76-DP00613 with the United States Department of Energy.

BACKGROUND OF THE INVENTION

The present invention relates to electroless copper plating processes. In particular, the invention relates to optimization of electroless copper plating in order to allow plating upon ceramics.

Individual inductors, capacitors, and resistors typically have been manufactured as discrete components. Current technology for filter designs, particularly radio frequency (RF) filters utilizes discrete surface mount or leaded (i.e., with leads) inductors and capacitors that are attached to thick film network (TKN), thin film network (TFN), or printed wiring board (PWB) assemblies. Component qualification, fabrication, and testing of discrete devices is time consuming and costly to achieve the desired high reliability passive component and filter assemblies. The currently available individual components are separately manufactured, inherently causing excessive cost, variation in parts operational values and tolerances, and variation in reliability and quality of resulting components.

Current technology for the fabrication of discrete passive elements for surface mounting has changed little in the past several decades. For example, inductors for surface mounting typically are comprised of a magnet wire wound on a phenolic or powdered iron bobbin. The wound bobbin is attached to a frame, and the magnet wire is soldered or welded to the frame. The discrete parts are then transfer molded to the final mechanical configuration and electrically tested to customer requirements. Manufacturers have, in some cases, automated the critical winding and lead attachment processes, but variations in magnet wire distribution, bobbin geometry, and assembly processes result in typical inductance tolerances of +/−10 percent at 90 percent yield factors. Requirements for parts with +/−5 percent or better inductance tolerances require in-process screening and final acceptance testing which adversely impact unit cost, production time, and ultimate quality. In addition to the extensive qualification tests necessary to qualify a family of chip inductors, lot sample destructive physical analysis and environmental tests are required to verify material compatibility and product reliability.

Some non-wirewound or planar inductors have been developed. Typically, however, they have been developed to be manufactured as discrete elements, with the attendant quality control and cost hurdles to be overcome. Many of these existing planar inductors utilize a spiral circuit pattern resulting in one of the terminals of the spiral being in the center of the spiral, requiring a separate jumper lead across the spiral to be utilized to complete the circuit path. The proximity of the jumper lead to the spiral and means of application can change the value of the overall inductance and efficiency of the device, decrease reliability, and increase production costs.

Historically, the reliability of inductive devices has lagged behind other discrete passive and active electronic components. While the materials and manufacturing processes for other devices have gone from individual to controlled batch processing, fabrication methods and materials for magnetic devices have, for the most part, remained unchanged. Needs exist for high-reliability chip inductors, especially in the 2–500 nH range having +/−5 percent or better inductance tolerances. For example, engineers increasingly are specifying +/−2 percent tolerance components to minimize costly tuning assemblies, particularly in the RF range.

Capacitors and resistors have been manufactured to a limited extent as discrete planar components, although typically as individual elements in single manufacturing processes. As discussed above, individual component production, inherently, does not lend itself to high reliability and repeatability operations. Thus, there is a need for a highly reliable, repeatable, and cost-effective process to manufacture electronic components and networks on chips.

One particular impediment to the manufacturing of high precision planar capacitors and inductors has been the lack of an effective means to electroless copperplate nonconductive substrates. Alternative means of providing a conductive plating base, such as use of conductive polymers which is discussed in U.S. Pat. No. 5,298,687, which is hereby incorporated by reference, presents a variety of limitations for chip devices, such as the need for thick seed layers and thick circuit lines when using conductive polymers. Thickness of seed layers, and other characteristics of conductive polymers adversely affect circuit operational characteristics, especially at RF frequencies. Thick circuit lines limit density of circuit lines and adversely effect production of devices, especially multi-turn inductors. Thus, it is of importance that an effective electroless copper technique is available.

OBJECTS AND SUMMARY OF THE INVENTION

A primary object of this invention is to provide a high quality, high reliability means of bulk manufacturing planar network chips and passive component chips.

Another object of this invention is to provide an effective means of bulk producing precision tolerance planar network chips and passive component chips.

A further object of this invention is to provide a means to effectively coat a nonconductive substrate with an electroless copper-type layer for plating operations.

Other and further objects of this invention are apparent from the specification, drawings and claims herein.

The present invention to address the needs described above, is a planar network chip, which is manufactured for high reliability and repeatability at relatively low cost. Microcircuit step-and-repeat plating and printing technology is utilized to form the network components (inductors, capacitors, and resistors) on a rigid substrate, which serves as a platform for the components. This produces a device that is inherently smaller and more rugged than previous devices generally available. Unique electroless copper plating techniques preferably are utilized as part of electrocoating processes to form circuit and element conductive layers.

Fabrication of the planar network chip requires unique fabrication steps to produce a reliable device at low unit cost. The method utilizes a ceramic platform for production of a large number of very uniform chips and allows automated testing for low unit cost.

BRIEF DESCRIPTION OF THE DRAWINGS

FIG. 1 shows an isometric exploded view of a typical present invention showing several layers of inductor spirals and dielectric formed as a single inductor chip.

FIG. 2 is a top view of an overall present invention substrate wafer, machined for production of four inductor chips. (For clarity, only four chips are shown, although normal production quantities would be far greater.)

FIG. 3 is a view of the bottom of an overall substrate wafer according to the present invention, showing the pads 12, interconnecting conductive paths 32, and electroplating grounding network 31 required for electroplating the pads and coil windings (spirals) for an inductor chip.

FIGS. 4A & 4B are back and front sides respectively of a present invention wafer with an inductor-capacitor network. The capacitor portion 45 and inductor portion 46 have been shown on opposite sides in this example wafer. This wafer is shown as a layout of 4 rows of 18 chips per row.

FIGS. 5A, 5B, and 5C show a close-up and a schematic of the present invention filter network as shown in FIGS. 4A and 4B.

FIG. 6 is a flow diagram showing an overview of the present invention chip production process.

DESCRIPTION OF THE INVENTION

Figure 7:
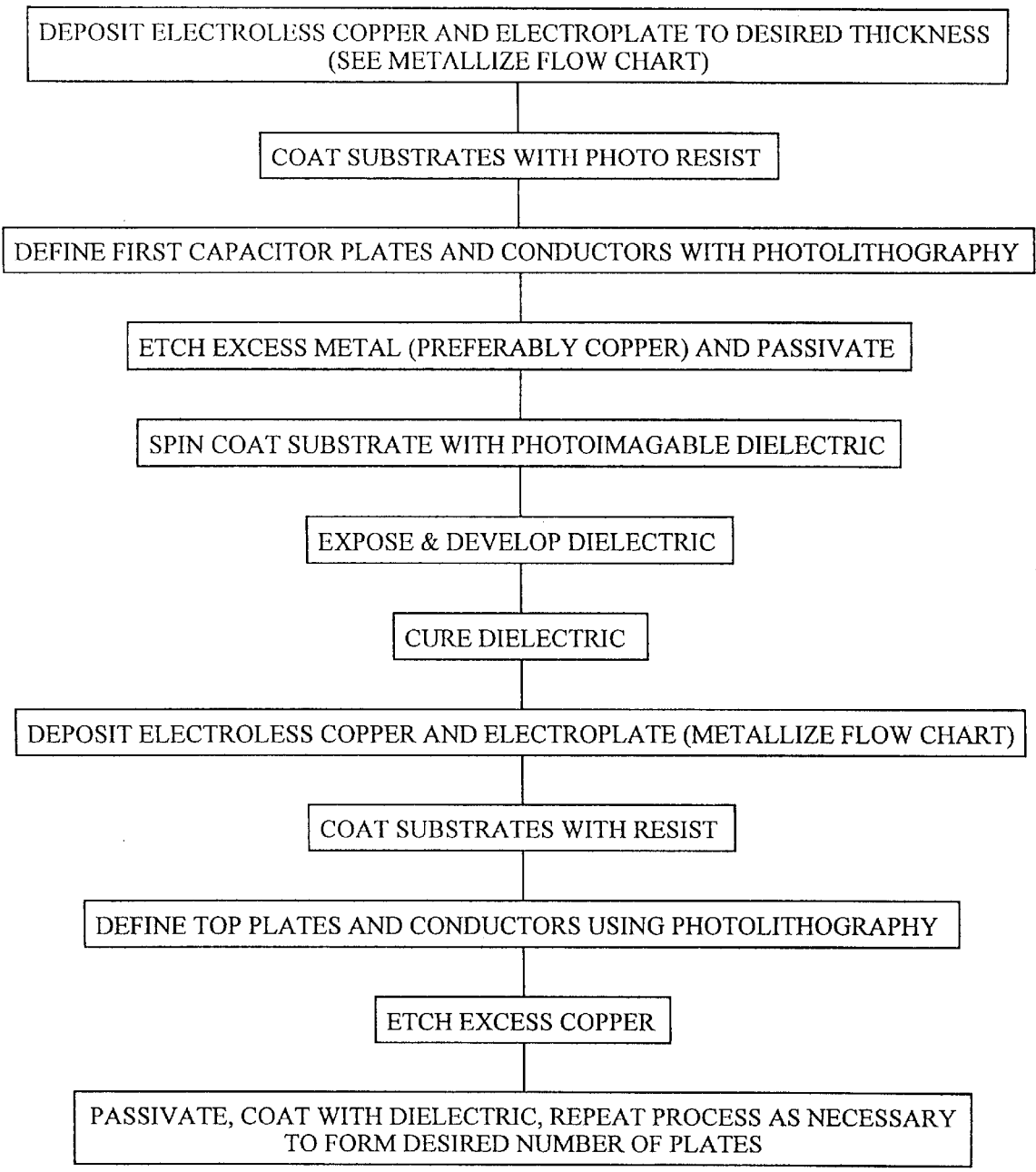
FIG. 7 is a flow diagram of a preferred present invention process for forming capacitors in the chip production process.

The present invention is directed to a surface mountable, high precision, highly reliable planar network chip. The chip is comprised of combinations of resistors, capacitors, and/or inductors, including individual passive elements (inductors, capacitors, or resistors and combinations thereof), formed onto a substrate wafer as part of a single process to batch manufacture a plurality of chips.

As best seen in FIGS. 1–3, one embodiment of the present invention is a multilayer planar inductor chip 10. The chip is comprised of a substrate 11 upon which alternating dielectric layers 16 and conductive spirals 15 are formed in a stacked relation. The spirals 15 are interconnected through vias 14 formed through the dielectric layers 16 and interconnected with various plated conductor circuits 17. The inductor thus formed is interconnected to conductive pads 12 through holes 22 laser machined in a wafer 20. Individual substrate chips 11 which form the base for the planar chip inductor 10 are shown defined on a wafer 20 best shown in FIG. 3. Mechanical registration slots 21 are machined in the periphery of the wafer 20 for registration and accurate placement of the variety of masks, etches, etc. as are described herein.

A conductor network 31, 32 is shown which is utilized in various plating operations if the conductive polymer described below is utilized. These elements are not required for processing if the preferred electroless copper plating is utilized.

FIGS. 4 and 5 show a Butterworth filter network of the present invention. FIG. 4A shows a wafer layout of a grid of individual filter network chips 45 formed on a larger wafer 20. Again, mechanical registration slots 21 are shown, as are conductor networks 31, 32 used for plating operations with conductive polymer. As best seen in FIG. 5A, a number of multilayer capacitors are deposited on one side of a chip 10. Capacitors 52 (labeled C1A, C1B, and so forth) are shown in FIG. 5A. FIG. 5B shows the reverse side of the same chip with inductors, labeled "L2A, L2b, and so forth formed thereon. FIG. 5C is a schematic of the inductors and capacitors interconnected into a functional filter network.

The flow of the basic process of formation of chips on the wafer is shown in FIG. 6. The chips are formed on a ceramic wafer, that has been pre-machined with registration slots to allow accurate mechanical placement of the wafer for the various printing processes and accurate placement of laser-drilled through-holes.

The wafers, upon which hundreds of chips may be formed, are produced using automated manufacturing processes and photolithographic screens and masks, that have been developed in the art to be extremely accurate, to define multilevel conductive patterns on the ceramic base and subsequent dielectric layers on both sides of the wafer to form discrete inductors, resistors, and capacitors. Interconnection of these devices by way of conductive paths and plated through-holes in series and parallel combinations can be made to produce RF low-pass, high-pass, band pass, delay line, and other passive element electronic networks.

Formation of resistors is generally the first passive elements for processing temperature reasons. Resistors may readily be formed by use of established thin or thick film techniques.

Capacitor formation is generally the next process, utilizing multilayers of conductive film separated by an appropriate dielectric, preferably polyimide, to achieve desired capacitance levels.

The inductor portion of the network is comprised of one or more circuit loops. Each circuit loop forms a planar spiral pattern. (The term spiral as used herein is not intended to be limiting and includes any combination of squared-off, straight and curved sections). Multiple layers of circuit loops interconnected by vias and separated by dielectric may be formed to achieve desired inductance levels.

A uniquely optimized electroless copper process preferably is used to deposit conductive layers for plating metal for the electronic elements. Conductor and elements (capacitor plates and inductor windings) are photolithographically defined and etched from each successively-plated layer.

In order to minimize electric (E) and magnetic (H) field interaction between the inductors (L's) and capacitors (C's) at RF, the capacitors preferably are all deposited on a first side of a wafer and, thus, physically isolated (nominally 0.040 inch (0.10 cm)) from the inductors, which are located on the second side. Operation and reliability may also be further enhanced by using a high temperature dielectric material between layers and as a cover coat over both sides of the wafer to improve the electrical characteristics of the networks and to provide protection from chemical and environmental stresses after the wafer is diced.

Prior to dicing of the wafers, the individual chips (containing individual passive electronic elements, RF filter networks, delay line networks and the like) can be tested using an automated computer-controlled RF probe station consisting of a six-axis test platform, an impedance or spectrum analyzer, and an RF probe calibrated to the point of test.

Preferred Embodiment

The preferred embodiment dimensions and materials are based upon sizes and materials utilized in feasibility testing the current invention and are not intended to be a limitation upon the claimed invention.

As best seen in FIGS. 4A & 4B, one set of feasibility testing successfully utilized a standard size 4.5 inch×3.75 inch×0.040 inch (11.4×9.5×0.1 cm), 96 percent alumina substrate wafer 20. Other platform materials would be acceptable; however, this family of ceramic materials is ideally suited for the high temperatures (up to 1000° C.) for wafer preparation, laser drilling, firing of resistor materials, and dielectric cure temperatures. Another advantage of the ceramic platform is the coefficient of thermal expansion (COTE) of such platforms closely match the COTE of the RF filter and TFN or TKN networks where many of these devices would be used. Thus, because differential expansion is minimized, cracked or broken solder connections during exposure to the high stress thermal requirements of high reliability assemblies would be minimized.

As best seen in FIGS. 1–3, one example of the present invention is a set of inductor chips 10 on the wafer 20, which in tests were sized and designed to meet MIL-SPEC-M8344618 type (2.79×2.667×1.778 millimeters). FIGS. 2–4 show an exemplar substrate wafer. This wafer size is anticipated to allow production of about 400 planar chips per wafer. Larger or smaller wafer sizes could be used for different production needs. A feasibility testing run producing inductor chips was successfully accomplished for a 16×16 matrix of inductor devices, for a total of 256 planar inductor chips.

Another example of test embodiment of the present invention is a wafer with multiple RF filter networks as shown in FIGS. 4A, 4B, and 5. The array shows the layout of a 72 (4×18) low pass 7-pole Butterworth-type filters, again on a standard 4.5 inch×3.75 inch×0.040 inch (11.4.× 9.5×0.1 cm), 96 percent alumina substrate wafer. FIGS. 4A and 5A shows the layout of the back side, which contains the capacitor networks C1A, C1B, C3, C5, and C7. FIG. 4B shows the top side of the wafer, which has all of the inductors L2A, L2B, L4A, L4B, L6A, and L6B that are, interconnected to the capacitors by way of through-plated holes to form the connections for the filter networks. FIGS. 5A and 5B show a magnified view of the capacitors, inductors, and the pads that connect to the plated through-holes or I/O terminals. This layout shown was designed to fit a 16-pin Dual In-Line (DIP) or Leaderless Chip Carrier (LCC) package where side clips or wire bonded connectors could be used to connect the device to external terminals. The I/O terminals can also be gold or solder plated for surface mount applications. This design concept is not limited to wire bonded terminations or to one physical size. The wafers and filter networks can be expanded or made smaller depending on unique design and processing limitations. The higher frequencies generally require smaller values of capacitance and inductance and thus can be designed with a smaller footprint, increasing the number of devices per wafer. The frequency range of the planar devices of the present invention is not restricted to but generally falls in the frequency range from 1.0 MHz to 1.0 GHz.

Wafer Preparation

One important aspect of this invention is utilizing a wafer base to allow bulk precision production of present invention chips. As shown in FIGS. 2 and 4a, substrate wafers 20 are precision machined to incorporate mechanical registration slots 21. Use of these slots allowed precise registration of the wafer 20 for various screen printing, plating, electrical testing processes, as well as dicing of the wafer 20 into individual chips 10.

After establishing mechanical registration and laser-drilling the through-holes, the balance of the manufacturing sequence generally is dictated by processing temperatures. A summary of the process flow is shown in FIG. 6. Not all steps, however, pertain to all devices. For example, in RF planar networks such as are shown in FIGS. 4A, 4B, and 5 containing only capacitors and inductors. The capacitors, through-holes, and ground plane generally are plated prior to the inductors because the preferred polyimide dielectric is cured at 350 degrees C., which is higher than required temperatures with the preferred materials used in the inductor formation. Of course, other sequences may be acceptable if temperatures and materials allow. The inductors, magnetic shield, and magnetic core, if required, are added to complete the assembly. Magnetic core materials are added to enhance the magnetic properties of the coil and to achieve higher inductance values for certain design applications.

Resistors

If resistors are incorporated into the network, the preferred approach would be to form the resistor material onto the substrate prior to application of the other network components. This is because typical resistor materials such as tantalum nitride need to be stabilized at about 300 degrees C. and thick film resistors would typically be fired at 800 degrees C. These temperature would cause damage to the subsequent layers if it was not performed first. The resistor material would be formed utilizing known microcircuit techniques such as thick film printing or deposition of the desired resistor material. After firing (for thick films) or stabilization (for thin films), the resistor material would be trimmed to a specified resistance value and then, if necessary, covered with a dielectric layer, leaving connection points exposed.

Connection points would be interconnected to the other network components as desired by application of the conductive "seed" layers and plating of conductive materials in the desired patterns as discussed further herein.

Capacitors

A significant feature of this invention is the method of forming multilayer capacitors on a ceramic substrate alone or as part of a network. The materials and structure of these capacitors make these capacitors very temperature stable (less than 5% variation over −65°–125° C.), with low dissipation (under 1 percent), suitable for high temperature use (over 350° C.) with a high breakdown strength. (Refer generally to FIG. 7 for overview of this process.)

After machining registration slots 21 in the ceramic wafer 20, as shown in FIG. 4A and, if appropriate, application of resistors, proceed as shown below to form capacitors as follows:

1. Clean the substrate to remove detritus and prepare surface for electroless copper plating of seed layer .
2. Electroless copperplate (see below) over the entire wafer, including the through-holes and electroplate approximately 0.0005 inch (0.0013 cm) on both sides and through-holes of the wafer.
3. Using standard photolithography techniques (resist coat, expose, develop), pattern the copper circuitry on both sides of the substrate. Using phototools, cover both sides of the wafer with photoresist where copper is to remain (known in the art as panel plating) on the alumina substrate. This includes the first metal planar capacitor plates 52, first metal connectors 51, through-hole pads (nominally 0.020 inch; 0.051 cm)) 54, the through-holes, plating pads 31 and a series of nominally 0.010 inch (0.025 cm) cell connecting grids 32 (applicable when conductive polymer is used, not applicable when electroless copper is used) on the wafer back side that interconnect the rows and columns to provide equipotential paths for uniform copper plating (FIGS. 4A & 5A). On the top side, the photoresist is added around all through-holes and the ground plane 53, which includes the rest of the surface area, except for a setback of 0.010 inch (0.025 cm) from the edge of the filter profile and nominally 0.010 inch (0.025 cm) clearance around all through-hole pads 50. See FIG. 5b.

4. Etch the entire wafer to remove the electroless copper and electroplated copper, except in the areas that are protected by photoresist. Strip photoresist.

5. Spin coat a layer of photoimagable polyimide on the bottom side (capacitor side) of the substrate.

6. Photoimage the dielectric layer for the capacitor. The developing process will remove the polyimide from all areas, except the bottom capacitor plates. The polyimide preferably will extend beyond the plate area approximately 0.005 inches (0.013 cm) to prevent shorting on subsequent plating operations.

7. Cure polyimide at 350° C. for one hour. Cure in a nitrogen atmosphere.

8. Electroless copperplate the entire substrate and electroplate approximately 0.0005 inches (0.013 cm) of copper.

9. Use standard photolithography techniques (coat resist, expose, develop) to pattern the top capacitor plate and interconnects to the via pads.

10. Etch the wafer to remove electroplated and electroless copper, except in area protected by the photoresist. Strip resist.

11. Optionally, if circuitry protection is desired, spin coat another layer of photoimageable polyimide onto the capacitor side (bottom side). Photoexpose and cure polyimide. This covers the complete two-plate capacitor side circuitry; additional plates are similarly formed as above prior to depositing of polyimide.

12. Use phototools to mask off the top side surface and the bottom side I/O terminals.

Polyimide dielectric material was selected because of an acceptable dielectric constant is ($K \approx 3.5$) low dissipation losses, stability in a wide range of temperatures, high breakdown strength, and other advantages include a controllable uniform thickness using spin coating, and that the material is photoimagable.

The value of a planar capacitor is described by the general expression $C=0.225K(n-1)A/t$, where C is capacitance in picofarads, A is the area of the copperplates in square inches, K is the dielectric constant ($\approx 3.5$ for polyimide), t is the thickness of the dielectric in inches, and n is the number of plates. (Or $C=8.85\times10^{-12}K(n-1)A/t$, where A is in square meters, and t is in meters). For most RF applications, the value of capacitance needed for low pass, high pass, and band pass filters can be achieved in an area less than 0.125 inch (0.81 cm$^2$) square. If larger values of capacitance are required in a small area, multi-plate planar capacitance can be fabricated using the same process. For example, if the calculated value of capacitance in a given area indicates that four plates are needed, the first and third plates would be electrically connected in parallel by vias and isolated by dielectric layers from the second and fourth plates, which also would be connected in parallel by vias. This process can be expanded to produce multi-plate capacitors as required by design requirements.

As indicated earlier, processing of the capacitor and the through-plated holes and inductor terminal pads preferably is completed first because of the high cure temperature (350° C.) for the polyimide dielectric material. The preferred dielectric selected for the planar inductors is a screen printable polymer that cures at a lower temperature (200° C.). This is also the cure temperature for a dielectric polymer base containing treated magnetic powder material that can be used to shield stray magnetic fields and as a dielectric layer between coil windings to increase the magnetic permeability ($\mu$) of the planar inductors for larger inductance values (greater than 1.0 $\mu$H). In general, manganese zinc and nickel zinc nanoparticle ferrite powders is preferred above 100 MHz and J-type iron powder below 100 MHz.

Inductor Sequence

Another significant aspect of the present invention is the method of forming multilayer planar inductors using photoimaging step-and-repeat printing and plating techniques. This creates extremely accurate, stable inductors suitable for use alone or with the present invention capacitors and resistors in a variety of passive element filter networks.

Figure 8:
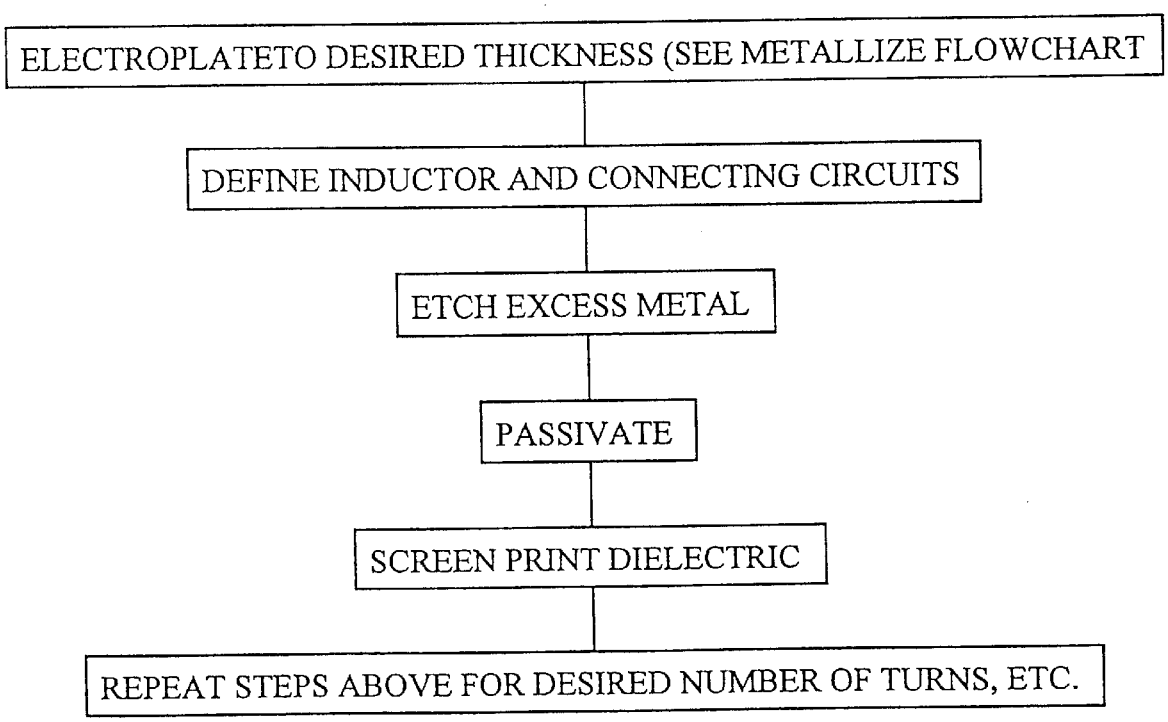
FIG. 8 is a flow diagram of a preferred present invention process for forming inductors in the chip production process.
Figure 9:
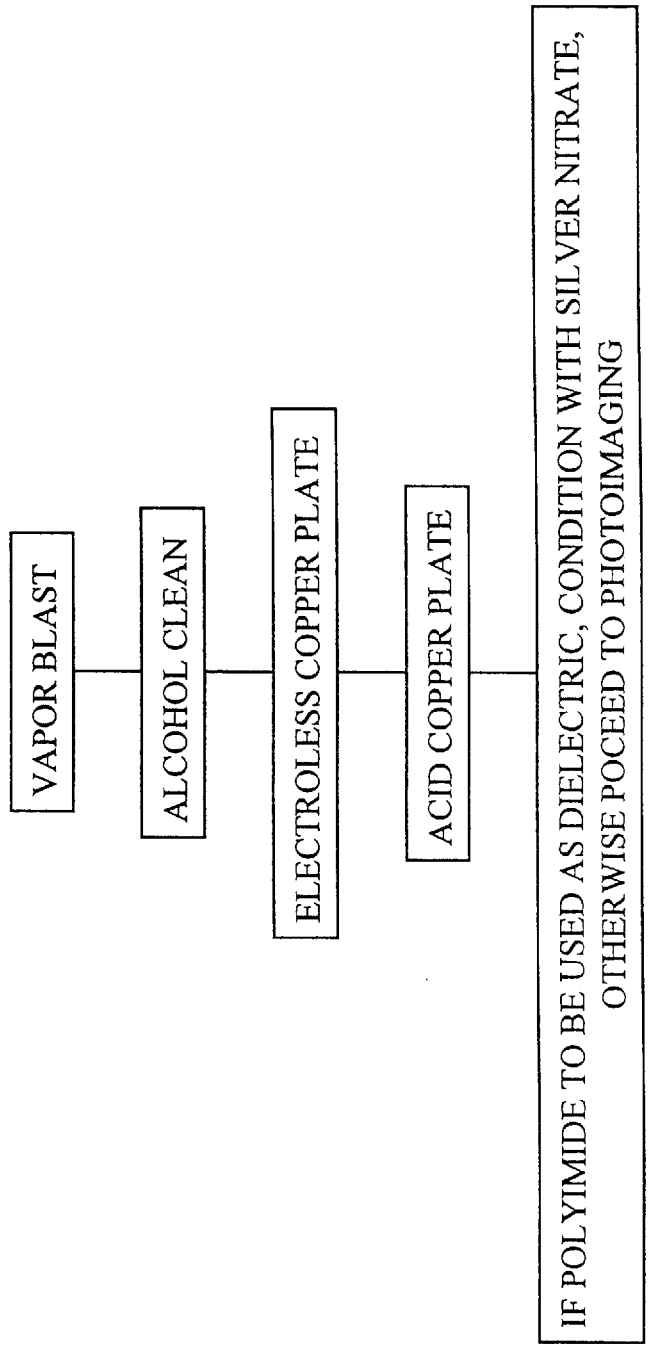
FIG. 9 is a flow diagram of a summary of the preferred present invention process to metallize substrates.

As noted above, it will generally be preferred for inductor formation to follow capacitor formation. A general inductor fabrication sequence is shown in FIG. 8. A preferred sequence of fabrication is as shown in the following:

1. As necessary, clean the substrate to remove detritus and prepare surface for electroless copper plating of seed layer.

2. As necessary, electroless copperplate (see below) over the entire side of wafer and through-holes of the wafer to a thickness of about 0.0005 inches (0.0013 cm). (Note that, depending upon the prior operations, copper may already be present upon this side of the wafer.)

3. Using standard photolithography techniques (resist coat, expose, develop), pattern the copper circuitry as necessary on the inductor side of the substrate. Using phototools, cover the appropriate side of the wafer with photoresist where copper is remain. This includes the first metal planar inductor leads, see 17 FIG. 1, through-hole pads (nominally 0.020 inch; 0.051 cm)) 13, the through-holes 22 and similar items.

4. Etch the entire wafer to remove the electroless copper and electroplated copper, except in the areas that are protected by photoresist. Strip photoresist.

5. Screen print polymer dielectric, such as Minico M-7700, as manufactured by Minico Inc., of Congers, N.Y., to define separation between inductor coils 15, etch and cure. Repeat the process to define the number of coils required to create the values needed.

6. Similar to the capacitor side, coat (spin coat or screen print as appropriate) polymer coating to protect circuits.

For air core inductors, the optimum process to minimize manufacturing time may be the use of spin-coated polyimide dielectric for both the capacitors and inductors. Using this processing technique, the capacitor and inductor metallization and dielectric layers can be accomplished in the same operation because the processing temperature would be the same.

In order to reduce interaction between the inductive an capacitive devices, a copper ground plane may be plated on one side (preferably the inductor side) of the wafer with appropriate openings in the ground plane layout to permit through-hole pads that are used to interconnect the inductors and capacitors and describe the RF networks. Alternatively, a polymer resin filled with powdered iron or ferrite nanoparticles can be printed on the one side of the ceramic platform (preferably the inductor side) to provide magnetic shielding between the inductors and capacitors in the filter network.

EXAMPLE 1

It is instructive at this point to discuss in detail one set of tests run to demonstrate manufacture inductor chips alone.

These tests demonstrate the salient features of production of a set of inductor chips.

The wafers and chips are shown generally in FIGS. 1–3. After machining the mechanical registration slots 21, as discussed above, two precision through holes 22 per chip 12, a total of 512 for this run, 0.007 inches (0.018 cm) in diameter, were laser machined. These through holes are utilized as a conduit for electrically conductive means 13, refer to FIG. 1, to pass through to interconnect the pads 12 on the bottom of the final chip to the inductor spiral(s) 15 on the top of the chip 10.

The next step in the manufacturing process was to apply a conductive seed layer onto the bottom of the wafer and into the laser machined through holes of the substrate wafer 20, refer generally to FIGS. 2 and 3. (As discussed herein, if electroless copper is utilized for the seed layer, it is applied to generally all of the substrate, except portions masked off. Excess seed layer material is then etch removed.)

After application of the seed material to the substrate wafer 20, the top and bottom of the resulting coated substrate wafer 20 was screen printed with an etch mask to define the required pads 12 and through holes 22 including electrical connection pads 13. An area approximately 0.017 inches (0.043 cm)in diameter was masked on the top side of each hole 22 to define an area for connection of the through conductor 13. A grounding bus 31 (applicable only to the conductive polymer—not to electroless copper) around the working area of the bottom of the substrate for grounding during plating, and interconnecting conductors 32 between the pads 12 and the grounding bus 31 was also screen printed.

The substrate wafer 20 is then plated with the desired conductive material such as copper or gold, using standard electroplating techniques. For the test samples run, copper plating was utilized on the bottom side pads 12 and over-plated with gold to reduce any corrosion problems for repeated testing and handling of the sample planar inductor chips 10. Plating thickness of the samples was approximately 0.001 inches (0.0025 cm)thick over a 0.0006 inch (0.0015 cm) thick seed layer of conductive polymer or electroless copper.

The next step is to either print additional seed material to define a circuit layer or spiral directly upon the top of the substrate, or to print a dielectric layer onto the top of the substrate There appears to be some advantage to printing a dielectric layer first, in that, it helps to make the materials defining the top and bottom of the stack of inductor spiral more symmetric and, thus, predictable in their electrical characteristics.

For feasibility testing, the next step was to screen print a dielectric material, such as a polyimide-filled dielectric polymer, on the top of the surface of the substrate, leaving any required electrical connection pads 13 uncovered (typically two are required to complete the inductor circuit. A two layer, two turn per spiral inductor is shown in FIG. 1.)

Following application of the plating to the pads 12 and through holes 22, a dielectric layer 16, refer to FIG. 1, was then applied to the top surface of the substrate 17, except for the conductive pads 12 and through holes 22 including the electrical connection pads 13 which were masked off.

FIG. 1 shows a conductor 17 extending to the center of the substrate 11. This conductor was used to form the return current path from the top spiral 15 and is connected from level to level with vias 14. This required formation of a dielectric layer between the conductor 17 and the first spiral. Another method to complete the circuit path from the top spiral to the pads is to utilize only one loop in the spiral and locate the vias and holes near each other and near the edge of the chip. One advantage of this alternative approach is that it opens up the center part of the chip so that an additional hole may be drilled through the entire chip to allow insertion of a magnetic core to enhance the electrical properties of the chips.

Next a seed layer of conductive polymer was screen printed to define the desired spiral circuit pattern 15 beginning at one of the two through holes for each chip. Also, the circuit path (via) forming the electrical return side of the spirals 15 to the second pad 12 is covered with an etch mask. Etch is again used to remove unwanted electroless copper, followed by plating with an acceptable conductor. In the test samples OFHC (Oxygen-Free High-Purity) copper was used. The cross section of a conductor in the spiral pattern 15 for the test samples was approximately 0.001 inches (0.0025 cm) thick by 0.010 inches (0.025 cm) wide.

The steps of defining and plating the required circuit paths and applying dielectric are repeated until the requisite number of layers is achieved. Test chips have made with from one to 10 layers. For example, a five-layer, two turn per layer chip resulted in a 130 nH inductor.

Wafer Testing

Following application of all of the requisite layers of conductor and dielectric, but before dicing the individual chips from the substrate, testing of the chips on the wafer may be accomplished. Indeed, one significant advantage of production of quantities of chips on a large substrate wafer surface, is that uniformity of placement of the chips enhances automatic testing of the individual chips.

If the chip networks are all electrically connected during processing to permit electroplating (i.e., if a conductive polymer seed layer was used), to allow testing during processing the interconnects 32 must be removed; as with a diamond-impregnated saw.

Automatic testing may be accomplished, for example, by utilizing a computer-controlled automated probe station, driving an Impedance Analyzer or a Spectrum Analyzer, such as Hewlett-Packard Corporation of Palo Alto, Calif. models HP4191A and HP8783, respectively, and a six-axis test bed capable of testing and performing statistical analysis on the electrical components. Utilizing standardization techniques known in the art, such as use of a calibration wafer standards on a ceramic substrate, allows automated testing of the individual chips on the substrate. If there is a unique designation for each chip on a wafer, such as alpha-numeric row and column numbers, individual chips may be selected from the lot as required after testing is complete and the chips have been cut apart from the substrate wafer.

Plating Layer Application

Electroless Copper

The preferred techniques for applying a seed layer utilized "electroless copper" plating technique are discussed below. Other methods for applying the seed layer may be utilized, such as application of a conductive polymer utilizing standard screen-printing techniques such as is discussed in U.S. Pat. No. 5,298,687. However, the electroless copper technique is preferred, especially for high frequency applications.

The electroless copper seed layer is preferred to other conductive polymer-type seed layers for two primary reasons. The first and most important is the thickness of electroless copper, which is in the range of 20–30$\mu$ inches (51–76$\mu$ cm) containing few, if any, voids. A conductive polymer seed layer, on the other hand, is approximately 500$\mu$ inches (1270$\mu$ cm) thick and contains many microvoids when cured. At low frequencies (below 1.0 MHz), the voids do not appreciably affect circuit function; however, at RF frequencies, the skin effect losses do become significant and result in a degradation of the circuit performance. For example, a limitation of the conductive polymer technique for high frequency circuits used in the inductor chip test samples was that it resulted in a relatively low Q factor and self-resonant frequency (SRF) for the inductor components. The second advantage of the electroless copper seed layer is that with common photolithographic techniques, path widths as narrow as 0.003 inch (0.0076 cm) are easily patterned. The minimum width for a polymer seed layer is approximately 0.008 inches (0.020 cm). For the planar inductors, the thin conductors (0.003 inch; 0.0076 cm) result in an increase of turns per unit area, and a subsequent increase in total inductance of each winding which can be estimated by the general expression $Lai=[(4\mu_o a_i)/\pi]ln[4a/w]-1]$, where $\mu_o$ is the permeability of air, the length of a side of the conductor is $2a$, in cm and the conductor width w, in cm. The total inductance is equal to the sum of the self-inductance of each turn (Lai). The thinner conductor also allows an increase in the spacing between turns, which reduces the inter-winding capacitance and improves (increases) the self-resonant frequency of the coils. This becomes a significant design consideration, as the operating frequencies approach 1.0 GHz. Although the electroless copper technique is preferred in the high frequency application for the reasons discussed above, other techniques known to those skilled in the art for forming of a plating surface on the substrate may be utilized where the particular application so allows.

An important aspect of the present invention is the use of electroless copper process to plate a ceramic wafer. Electroless copper plating application in general is known for a variety of uses; however, the use of it for application of a seed layer on a ceramic wafer in this type of application is unique in that electroless copper previously has not been feasible to use on ceramics. The electroless plating process sequence and settings utilized in the electroless plating steps for the current invention are disclosed below. This process is a basic electroless copper plating process familiar to those skilled in the art, which has been optimized in a novel way to produce acceptable coverage and adhesion on the substrates involved. As would be apparent to one skilled in the plating arts, some variations in the precise time, temperature, and other settings noted may also produce acceptable results. The electroless copper plating steps are as follow:

Clean the substrate in preparation for plating with fine aggregate spray (e.g., vapor blast using silicon dioxide slurry of 0.5 lb/gal (291 g/L) sprayed at 50 psi (345 KPa) for approximately 30–60 seconds.) The aggregate spray is followed by a solvent rinse such as isopropyl alcohol.

Following cleaning, plate with electroless copper by sequentially dipping racked substrates in plating tank solutions as follows:

A. Alkaline cleaner/conditioner, such as Cleaner/Conditioner 231 by Shipley Company of Newton, Mass., to remove debris (contaminants and organics) and prepare the substrate for receipt of the tin-palladium colloid.

Time: 4.5–5.5 minutes
    Temperature: 105°–115° F.
      (40.6°–46.1° C.)
    Agitation: Mechanical & Recirculation Pump
    Solution Controls: Normality 0.028–0.046;
      Copper 2.0 grams/liter (g/L)
      maximum B. Reverse Osmosis Counterflow Water Rinse. (For counterflow rinses, tank for stage 2 flows into tank for stage 1).

Time (Stage 1) 1–2 minutes
    Temperature Ambient
    Time (Stage 2) 1–2 minutes
    Temperature Ambient
    Agitation: Mechanical & Air C. Microetch with acid solution, such as Shipley Company 748 Etch Solution, to provide clean copper surfaces for acceptance of the tin-palladium colloid. This step is only necessary for the dummy panels noted below or when reprocessing subsequent copper layers on a preprocessed substrate.

Time: 55–65 seconds
    Temperature: Ambient
    Agitation: Mechanical & Air
    Solution Controls: Copper 0.5–8.0 g/L;
      pH 1.0 maximum;
      Active Oxygen 2.6–3.1 g/L D. Reverse Osmosis Counterflow Water Rinse Time (Stage 1): 1.5–2 minutes
    Temperature: Ambient
    Time (Stage 2): 2–3 minutes
    Temperature: Ambient
    Agitation: Mechanical & Air E. Sulfuric Acid (10%) is used to neutralize any remaining salts after the microetch step.

Time: 0.75–1.5 minutes
    Temperature: Ambient
    Agitation: Mechanical
    Solution Controls: Sulfuric Acid 8–12 percent by volume F. Reverse Osmosis Water. Rinse.

Time: 2–3 minutes
    Temperature: Ambient
    Agitation: Mechanical & Air

G. Stannous chloride solution, such as Shipley Company Cataprep 404, is used to precondition the part prior to tin-palladium deposition.

Time: 0.75–1.5 minutes
    Temperature: 110°–120° F. (43.3°–48.9° C.)
    Agitation: Mechanical & Recirculation Pump
    Solution Controls: Specific Gravity 1.120–1.175 at operating temperature H. Stannous chloride solution, such as Shipley Company Cataposit 44, which contains a tin-palladium colloid. The palladium will serve as the catalyst for electroless deposition.

Time: 3.75–4 minutes
    Temperature: 110°–120° F. (43.3°–48.9° C.)
    Agitation: Mechanical & Recirculation Pump
    Solution Controls: Palladium 80–120% of new solution concentration.
      Stannous Chloride 3.0–9.0 g/L. Specific Gravity 1.120–1.175 at operating temperature.

I. Reverse Osmosis Counterflow Water Rinse

Time (Stage 1): 1.5–2 minutes
    Temperature Ambient
    Time (Stage 2): 0.5–1.5 minutes
    Temperature: Ambient
    Agitation: Mechanical J. A postactivation solution, such as Shipley Company Accelerator 240, to remove the tin from the tin-palladium colloid.

Time: 2.75–3.25 minutes

Temperature: 105°–115° F. (40.6°–46.1° C.)

Agitation: Mechanical

Solution Controls: Acidity 0.75–1.15N

Copper 0.7 g/L maximum

K. Reverse Osmosis Water Rinse

Time: 1.5–2 minutes

Temperature: Ambient

Agitation: Mechanical

L. Deionized (DI) Water Rinse

Time: 1–2 minutes

Temperature: Ambient

Agitation: Mechanical

M. Electroless copper (alkaline chelate) solution containing sodium hydroxide, formaldehyde, and copper, such as Shipley Companies 328 Q. The electroless copper bonds autocatalytically to the exposed palladium molecules providing copper coverage.

Time: 19–21 minutes

Temperature: Ambient

Agitation: Mechanical & Air

Solution Controls: Copper 2.5–3.7 g/L

Sodium Hydroxide 4.0–5.0 g/L

Formaldehyde 7.0–9.0 g/L

N. Reverse Osmosis Counterflow Water Rinse

Time (Stage 1): 1.5–2 minutes

Temperature: Ambient

Time (Stage 2): 1–2 minutes

Temperature: Ambient

Agitation: Mechanical & Air

O. Sulfuric Acid (3 percent by volume solution)

Time: 1–1.5 minutes

Temperature: Ambient

Agitation: Mechanical

Solution Controls: Sulfuric Acid 2.5–4 percent by volume

P. Reverse Osmosis Water Rinse

Time: 0.75–1.5 minutes

Temperature: Ambient

Agitation: Mechanical & Air

Following the electroless plating operations, substrates are removed from plating tanks, unracked, and air dried while blowing with nitrogen or dry air to remove droplets. Best results are obtained if the following are observed:

1) Bath life of electroless copper is typically a maximum of 1 week.

2) Dummy panels are run before and with the actual parts to ensure bath activation.

3) Weight gain panels are run with every load. Weight gain is controlled between 20–40 microinches (5.1 $10^{-5}$ to 10.2 $10^{-5}$ cm).

4) Electroless copper bath is analyzed before each run.

5) All process solutions are made up using deionized (DI) water.

An important aspect of this invention is optimization and application of electroless copper plating. Although a variety of systems for electroless copper plating exist, none of the available systems tested provided any effective coverage of the preferred ceramic substrate of the present invention. Indeed, as first tested, no coverage of such a substrate was achieved. By process of experimental design, the electroless copper process was characterized to determine the parameters which most directly impacted the performance of the plating operation, and it was discovered that four critical parameters existed: the dwell time in step A, cleaner/conditioner; the dwell time in step C, microetch; the dwell time in the accelerator, step J; and the age of the electroless copper bath in step M. Thus, various other electroless copper processes in addition to the one described above in which the identified parameters have been properly optimized, should provide acceptable electroless copper plating results on substrates.

As noted above, no coverage, and, thus, no adhesion was measured with commercially applied electroless copper. The optimized process achieved complete coverage and average adhesion values of 0.802 lb/in-width (1.4N/cm-width) in a standard adhesion peel test.

Conductive Polymer

Although the preferred embodiment utilizes electroless copper, for certain applications, use of conductive polymer may be a suitable alternative. If a conductive polymer seed layer is used, such as is discussed in U.S. Pat. No. 5,298,687, grids 31, 32 must be used for electroplating connections.

If grids are present (e.g., when a conductive polymer seed layer is used), it is, necessary to disconnect any plating grids that are used during processing as conductive paths to electroplate the copper patterns of the planar inductors prior to testing. The plating grids 31, if used, are located between the rows and columns of plated elements and are connected to the appropriate through-hole pads and to a plating pattern 31 which surrounds the array of components on the wafer (FIG. 3). This grid network is connected to a current source during electroplating of the planar devices. The purpose of the network is to achieve equipotential conductive paths that ensure uniform plating thickness of the circuit elements.

For testing purposes, the grids are disconnected, typically using a diamond impregnated saw. Once disconnected, the wafer is intact, but each network is electrically isolated for testing.

We claim:

1. A process for electroless copper coating on a substrate, comprising the steps of:

cleaning the substrate alkaline cleaning and conditioning for a dwell time of about 4.5 to 5.5 minutes;

rinsing with Reverse Osmosis water;

preconditioning said substrate in a stannous chloride solution from about 0.75 to about 1.5 minutes;

treating with a tin-palladium colloid;

postactivating with a solution to remove tin from the tin-palladium colloid from about 2.75 to about 3.25 minutes; and applying electroless copper in solution, which solution has been used less than about one week.

2. The process as claimed in claim 1 comprising the additional step of:

microetching from about 55 to about 65 seconds subsequent to the step of rinsing with reverse osmosis water and prior to the step of preconditioning in a stannous chloride solution.

3. A process for optimizing an electroless copper coating process so as to maximize overall adhesion and coverage of the electroless copper onto a substrate, wherein the electroless copper coating process comprises the steps of: initial abrasive cleaning the substrate, alcohol rinsing the substrate, immersing the substrate in an alkaline cleaning and conditioning solution, rinsing the substrate with reverse osmosis water, immersing the substrate in a preconditioning solution of stannous chloride, treating the substrate with a tin-palladium colloid, immersing the substrate in a postactivating solution to remove tin from the tin-palladium colloid, and applying electroless copper in solution; the optimizing process comprising the steps of:

adjusting the time in which the substrate is in the alkaline cleaning and conditioning solution so as to maximize adhesion and coverage of the resulting electroless copper on a substrate;

adjusting the time in which the substrate is in the post-activating solution so as to maximize adhesion and coverage of the resulting electroless copper on a substrate; and adjusting the age of the electroless copper bath so as to maximize adhesion and coverage of the resulting electroless copper on a substrate.

* * * * *